United States Patent [19]

Briska et al.

[11] 4,249,970
[45] Feb. 10, 1981

[54] METHOD OF BORON DOPING SILICON BODIES

[75] Inventors: Marian Briska; Klaus P. Thiel, both of Boeblingen, Fed. Rep. of Germany

[73] Assignee: International Business Machines Corporation, Armonk, N.Y.

[21] Appl. No.: 67,846

[22] Filed: Aug. 20, 1979

[30] Foreign Application Priority Data

Sep. 7, 1978 [DE] Fed. Rep. of Germany ....... 2838928

[51] Int. Cl.³ .................................... H01L 21/225
[52] U.S. Cl. .................................. 148/188; 148/186; 148/189
[58] Field of Search ............... 148/188, 189, 187, 186

[56] References Cited

U.S. PATENT DOCUMENTS

| | | | |
|---|---|---|---|
| 3,066,052 | 11/1962 | Howard | 148/189 |
| 3,542,609 | 11/1970 | Bohne et al. | 148/189 X |
| 3,577,287 | 5/1971 | Norwich et al. | 148/190 X |
| 3,676,231 | 7/1972 | Medrecky et al. | 148/188 |
| 3,753,809 | 8/1973 | Gaier et al. | 148/189 |
| 3,806,382 | 4/1974 | Fitzgibbons et al. | 148/188 |
| 4,149,915 | 4/1979 | Bohg et al. | 148/189 X |

OTHER PUBLICATIONS

Parekh et al., *Solid State Electronics*, vol. 14, 1971, pp. 281–288.
Parekh et al., *Proc. of IEEE*, vol. 57, No. 9, Sep. 1967, pp. 1507–1512.
Busen et al., *J. of Electrochem. Soc.*, vol. 115, Mar. 1968, pp. 291–294.
Brown et al., *J. of Electrochem Soc.*, vol. 118, Feb. 1971, pp. 293–300.
Schorer et al., ESSDERC'77, Brighton Sep. 1977, pp. 14–16.

*Primary Examiner*—G. Ozaki
*Attorney, Agent, or Firm*—John A. Jordan

[57] ABSTRACT

An open diffusion method of doping a silicon body with boron. In a first open diffusion heating step, a boron glass is deposited upon the silicon body with a silicon-rich boron phase ($SiB_6$) formed beneath the glass where deposition is directly on silicon. The boron glass and $SiB_6$ layer are formed by exposing the silicon body to a gas mixture containing a predetermined boron quantity and boron and oxygen in a predetermined quantitative ratio. Etching steps then permit the removal of the boron glass without deleteriously affecting the $SiB_6$ layer or underlying silicon, or uncontrollably affecting any $SiO_2$ masking layers. In a second heating step, at least a part of the boron from the $SiB_6$ layer is driven into the silicon in an inert or oxidizing atmosphere.

11 Claims, 8 Drawing Figures

METHOD OF BORON DOPING SILICON BODIES

BACKGROUND OF THE INVENTION

1. Field of the Invention

The present invention relates to a method of doping silicon bodies through indiffusion of boron and, more particularly, to an open diffusion method of doping silicon bodies.

2. Description of the Prior Art

For diffusing boron into silicon, capsule diffusion methods are known as well as methods wherein silicon bodies are exposed to a gas which flows through a reaction tube and contains a boron source. With capsule diffusion methods, highly homogeneous and reproducible results can be obtained. Capsule diffusion methods, however, have disadvantages in the amount and complexity of material and apparatus required. For example, each batch run requires an expensive quartz capsule in addition to a high vacuum pump and its associated annealing furnaces. Furthermore, capsule diffusion methods involve a relatively high amount of manual operation such that it may not readily be incorporated in an automatic production line. Capsule diffusion methods are also not readily useable in those diffusion processes where, after the diffusion, an oxide is required to be grown for subsequent masking purposes.

Boron diffusions by means of a gas stream which contains a boron source and which flows past silicon bodies (hereinafter called "open diffusion") are much less complex insofar as apparatus and material is concerned. In addition, manual intervention is required relatively infrequently and thus, this type of diffusion is quite suitable for incorporation into an automatic production line. In typically employed open diffusion processes, a boron glass is produced on the surface of the silicon body which is to be doped with boron by heating the silicon bodies to a high temperature and exposing same to a gas stream containing oxidized boron. The oxidized boron is introduced into the gas stream by directing latter past boron-nitride wafers coated with $B_2O_3$ and heated to a high temperature. Alternatively, oxygen in the gas stream may be made to react with a material that is fluid (at room temperature) or gaseous and which contains boron.

An open diffusion process using a boron source comprising boron-nitride preferably coated with $B_2O_3$ is described, for example, in German Offenlegungsschrift 23 16 520. Open diffusion processes where boronbromide ($BBr_3$), fluid at room temperature, is used as a boron source are described, for example, in U.S. Pat. No. 3,676,231 to B. P. Medvecky et al, and in the articles entitled "The Influence of the Reaction Kinetics of $O_2$ and Source Flow Rates on the Uniformity of Boron and Arsenic Diffusions" in *Solid State Electronics*, 1971, Vol. 14, pp. 281ff, and "The Influence of Reaction Kinetics Between $BBr_3$ and $O_2$ on the Uniformity of Base Diffusion" in *Proceedings of the IEEE*, Vol. 57, No. 9, September 1969, pp. 1507ff. The description of an open boron diffusion process using as boron source, $B_2H_6$ gaseous at room temperature, is described, for example, in the article entitled "Ellipsometric Investigation of Boron-Rich Layers on Silicon" by K. M. Busen et al in the *Journal of the Electrochemical Society*, Vol. 115, March 1968, pp. 291ff.

If the $BBr_3:O_2$ ratio is not too low in the open diffusion processes, a silicon-rich boron phase ($SiB_6$) is obtained under the boron glass directly placed onto the silicon, as described in the above-cited article by K. M. Busen et al. As described there, the forming of the $SiB_6$ phase is advantageous for a well-controlled boron diffusion. This favorable effect, however, appears only when the $SiB_6$ phase is removed prior to the boron drive-in in the second heating process. Busen et al recommend for the removal of the $SiB_6$ phase either an etchant which also etches silicon, or using a two-step process where in the first step the phase is treated for ten minutes in boiling concentrated nitric acid and subsequently for 30 seconds is diluted HF. The use of silicon etchants is not advisable for silicon wafers upon which integrated circuits are to be applied and, thus, the two-step process may have to be applied several times to make sure that the $SiB_6$ phase is completely removed, as described by Busen et al.

It is clear that because of the lack of reliability of the etching process, the two-step method of Busen et al is not suitable for a manufacturing application. In their article entitled "Glass Source B Diffusion in Si and $SiO_2$" published in *Journal of the Electrochemical Society*, Vol. 118, February 1971, pp. 293ff, D. M. Brown and P. R. Kennicott therefore suggest a boron diffusion (with reference to the article by Busen et al) where the forming of the $SiB_6$ phase is avoided. This of course also excludes the attendant advantages of the $SiB_6$ phase. In the method described in German Offenlegungsschrift 23 16 520, the advantages mentioned by Busen et al are utilized in that the $SiB_6$ phase is converted, after its formation in a high temperature oxidation step, into an easily soluable oxide which is removed prior to the second heating process. In spite of these process steps, the method described in the Offenlegungsschrift has generally not been found to present homogeneous and reproducible results in the fabrication of low-doping diffusion areas (surface resistance: $>300$ $\Omega/\square$, penetration depth: approximately 1 $\mu m$) within very close tolerances over the silicon body and over an entire batch.

With the increasing trend towards closely packed, highly integrated, circuits the results obtained by means such as described in the above-cited Offenlegungsschrift are no longer fully satisfactory. In the production of highly doped areas, the intensive oxygen treatment after the boron oxide coating can have a very deleterious effect in many applications. Although it can be seen from the above-mentioned article that Busen et al attempted tests where, prior to the drive-in, only the boron glass and not the silicon-rich phase is removed, it is clear from the results obtained there that Busen et al have concluded that for obtaining favorable diffusion results the $SiB_6$ phase has to be removed prior to drive-in.

SUMMARY OF THE INVENTION

It is, therefore, an object of the present invention to provide a diffusion process for doping silicon with boron which is simple and inexpensive.

It is a further object of the present invention to provide a boron diffusion process which gives homogeneous and highly reproducible results in a simple manner.

It is yet a further object of the present invention to provide a boron diffusion process which can be widely used and easily controlled and surveyed.

It is yet still a further object of the present invention to provide a diffusion process for doping silicon with boron which may conveniently be integrated into a manufacturing line.

In accordance with the principles of the present invention, a method is provided for doping silicon bodies at least partially through the diffusion of boron. In a first open diffusion heating process step a boron glass layer is formed over said silicon bodies with at least a portion of the glass layer formed such that a silicon-rich boron layer (SiB$_6$) is formed therebeneath. The boron glass layer is formed in a manner so as to permit removal of the glass layer through particular etching steps without deleterious removal of the SiB$_6$ layer. This removal is made prior to a second heating step for driving into said silicon body the doping boron from said SiB$_6$ layer. The second heating process may be effected in an inert or oxidizing atmosphere. The advantages of the method as disclosed by the invention are particularly evident in that in the production of highly integrated circuits using this method, both for the production of base zones and for the production of structures showing sub-isolation together with subcollector areas, the number of emitter-collector short circuits in bipolar transistors is much lower than in the production of circuits with smaller integration density by using known methods.

The O$_2$:BBr$_3$ ratio and the boron source quantity added to the gas mixture per time unit are advantageously determined in such a manner that a boron glass is obtained which, in buffered hydrofluoric acid, is partially removed but which through being processed in hydrofluoric acid, then in hot nitric acid, and finally once more in hydrofluoric acid, is removed without any residues. It is of advantage to immerse the silicon bodies for ten seconds in a hydrofluoric acid diluted with water in a ratio of 1:10, then for ten minutes in a concentrated nitric acid heated to 95° C., and finally for 30 seconds in hydrofluoric acid (1:10). This etching process does not attack silicon, which is of particular importance in the handling of silicon bodies on or in which integrated circuits are made. Furthermore, the boron silicate glass is reliably removed in this etching process, without the SiB$_6$ phase being substantially affected. An important feature of the present invention is the highly reproducible results obtained with this etching process.

It has been found advantageous to use BBr$_3$ as a boron source and to expose the silicon wafers to a mixture formed at the coating temperature of BBr$_3$ and O$_2$ as contained in a flowing carrier gas. In the first heating process, with an inner diameter of the reaction tube of approximately 10 cm being assumed, it is advisable to operate with a carrier gas flow between 2 and 5 liters/minute and a stabilization flow between 0.5 and 1 liters per minute, and to add BBr$_3$ quantities between approximately 15 and approximately 30 milligrams/minute to the carriar gas during coating, and at least during coating an oxygen quantity adapted to the BBr$_3$ quantity in such a manner that the O$_2$:BBr$_3$ molar ratio lies between approximately 20 and approximately 65. If operation takes place within a reaction tube having an inner diameter of approximately 11 cm, the advantageous carrier gas flow lies between 3.5 and 8.5 liters/minute, and the advantageous BBr$_3$ quantity lies between approximately 18 and approximately 36 milligrams/minute.

Figure 1:
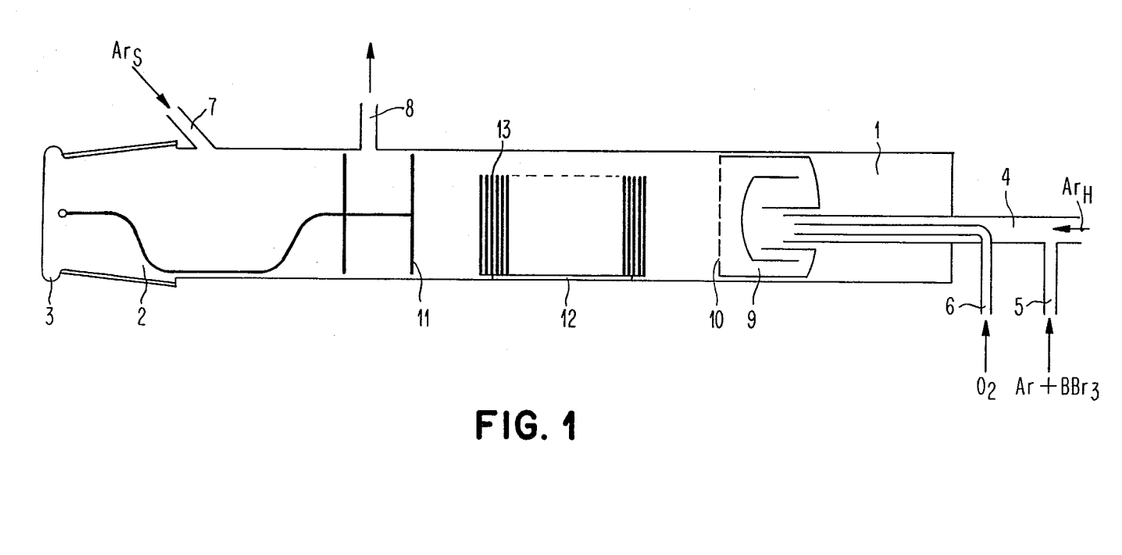
FIG. 1 is a schematic representation of an embodiment of a reaction tube which may be used for the method, as disclosed by the invention.

During the first heating process the silicon bodies, arranged in a boat perpendicularly to the gas flow and existing in the form of silicon wafers, are advantageously placed in a reaction zone which shows a flat temperature profile and into which the gas mixture from a mixing chamber is directed through a perforated plate provided perpendicularly to the tube axis and approximately filling the tube cross-section, and which is terminated by the perforated plate and by a baffle consisting of two quartz disks provided perpendicularly to the tube axis, the gas mixture being sucked off between the quartz disks by a pipe, and stabilization gas being introduced between the baffle and the tube and covered with a ground cap (see FIG. 1). Reaction tube design and gas flow define a reaction zone where all silicon wafers in the boat are exposed to the same conditions. The reaction conditions are further unified in that if no batch is in the tube (or not being pre-doped) the reaction zone is continuously kept at coating temperature, and in that the tube is rinsed with oxygen, and in that if during a predetermined period no batch has been processed in the tube, the tube is pre-doped for a predetermined period at coating temperature prior to its being used again, and in that the gas mixture flowing during the coating process is directed therethrough. Thus, all tube parts surrounding the reaction zone are coated with a boron glass layer which during the processing of a batch is equilibrated with the reaction gas so that the homogenity of conditions along the reaction zone to which the silicon wafers are subjected is improved still further. For producing doped areas which, after the second heating process with penetration depths (xj) between approximately 0.5 and approximately 1 $\mu$m, show surface resistances (Rs) between approximately 300 and 700 $\Omega/\square$, it is advantageous if operations during the first heating process take place at a temperature between approximately 850° and 950° C., and use an O$_2$:BBr$_3$ molar ratio between approximately 20 and approximately 65 with a quantity of approximately 15 to 30 milligrams per minute of BBr$_3$ being added to the carrier gas, with the overall gas flow being approximately 3.5 liters/minute, and if the second heating process is carried out in an oxidizing atmosphere.

The first heating process thus supplies a boron glass which is highly homogeneous with respect to its thickness and etchability. These specific characteristics of the method as disclosed by the invention also contribute to the fact that this embodiment of the method as disclosed by the invention presents a homogeneity and reproducibility of results [$\pm 5\%$ after the third heating process (see Table I)] which heretofore could not be reached in areas of such a low boron doping, not only over the individual silicon wafers but over the entire batches. Therefore, the method is of particular advantage in those cases where very strict manufacturing instructions have to be followed.

The above-mentioned embodiment of the method as disclosed by the invention is particularly suitable for generating base zones of bipolar transistors in highly integrated and closely packed circuits. It is possible to remain within close tolerances with very small base widths so that emitter-collector short circuits can be substantially avoided. A doped zone with a penetration depth of approximately 0.75 $\mu$m and a surface resistance Rs of 400$\pm$20 $\Omega/\square$ (after the third heating process) can be advantageously produced by subjecting the silicon wafers to a temperature of 875°$\pm$1° C. and a first gas mixture consisting of 3.2 liters argon per minute and 0.08 liters oxygen per minute for 15 minutes with the wafers standing in a reaction tube with an inner diameter of approximately 10 cm. Subsequently, this first gas mixture, which previously had been saturated with bromide boron at a temperature of 5° C., has 0.08 liters of argon per minute added to it and is directed over the wafers for 20 minutes. Finally, the first gas mixture is directed over the wafers for another 15 minutes and then, after cooling, the boron glass layer is removed and the wafers are subjected to 1.5 liters oxygen per minute for ten minutes at 925°±1° C., then to steam for 51 minutes, and finally for another ten minutes to 1.5 liters of $O_2$ per minute, with approximately 0.200 μm silicon dioxide being grown in the process.

For producing low resistance doping zones it is of advantage when in the first heating process the boron required for doping is introduced into the silicon at temperatures between approximately 900 and approximately 1000° C. under the influence of a minimum of oxygen, and when in the second heating process operations take place in an inert gas atmosphere. The oxygen used in the process can be advantageously reduced to a minimum in that in the first heating process the silicon wafers are exposed only briefly to a gas mixture containing both oxygen and the boron source, and during the rest of the time to an argon stream only. The above-mentioned embodiment of the method as disclosed by the invention is advantageous for making insulation areas and, in particular, subinsulation areas. In the production of sub-insulation areas it is of advantage if no re-oxidation is necessary because the entire oxide layer is subsequently removed anyway so that an epitaxial layer can be grown onto the substrate. It is of advantage to epitaxy that, after the boron glass removal, highly polished surfaces are obtained. Furthermore, the lateral outdiffusion from the areas produced during sub-insulation diffusion into the epitaxial layer is lower in connection with the method as disclosed by the invention than when using any other known diffusion process. The method is furthermore time-saving and inexpensive.

In the production of low resistance doping areas, the homogenity and reproducibility of results is less of a problem than in the high resistance doping areas. However, it should all the same be pointed out that the method as disclosed by the invention also permits highly homogeneous and reproducible results with low resistance doping areas. For producing a doped area in silicon wafers with a penetration depth of 0.8 μm and a surface resistance $R_s$ of 32 Ω/□, for example, it is of advantage according to the present invention to heat the silicon wafers in an argon atmosphere within approximately 22 minutes from approximately 900° to 970° C., to subsequently at 970° C. expose the wafers for four minutes to a flowing gas mixture of 3.6 liters argon, 0.1 liter oxygen and 0.1 liter argon which previously has been saturated with $BBr_3$ at a temperature of +5° C., to further expose said wafers for five minutes to an argon stream of 1.5 liters per minute, and subsequently, with the argon flow being maintained, to cool said wafers from 970° to approximately 900° C. within 20 minutes, and after removal from the furnace, to remove the boron glass, and finally to process the silicon wafers for 80 minutes at 1000° C. in a nitrogen or argon atmosphere.

This latter embodiment of the method, as disclosed by the invention, finds practical application in the production of structures where boron-doped sub-isolation areas are placed close to arsenic-doped subcollector areas. If an overlapping of these areas is to be avoided, sub-isolation and subcollector areas have to be sufficiently distanced from each other. This requires much space, which is contrary to the trend in semiconductor technology toward higher packing densities and highly integrated circuits. Up to now, however, overlapping had to be avoided, at least in those cases where the sub-insulation areas had to be generated by means of an open diffusion. This was necessary because in the overlapping areas there appeared dislocations in the silicon crystal. Dislocations are crystalline defects in the monocrystalline material. In the vicinity of these defects within the crystal, the doping impurities diffuse much more quickly than in the undisturbed crystal zones and thus, dislocations become a frequent cause of collector-emitter short circuits in bipolar transistors. Furthermore, dislocations to considerable extent cause collector-insulation breakdowns. G. Schorer et al have closely examined dislocations in As/boron overlapping areas, and describe the results in an article entitled "Generation of Dislocations in As/B Double-diffused Areas in Silicon" (cp. abstracts of the lectures delivered on the ESSDERC 77, Brighton 1977, pp. 14ff).

For investigation purposes, Schorer et al used silicon wafers which first had been exposed to an arsenic diffusion and subsequently to an open boron diffusion where, in a manner known in the art, in a first heating process the coating with boron was executed, and subsequently in a second heating process (without the boron glass having previously been removed) the boron is driven further into the silicon in an oxidizing atmosphere. Schorer et al found dislocations and concluded that there exists two types of dislocations which Schorer et al called "60°" and "90° dislocations". The authors furthermore found that the "90° dislocations" are formed during the oxidizing drive-in whereas the "60° dislocations" appear after the first heating process. Since it has been found that the dislocations appear only in those silicon zones which had been exposed to arsenic as well as to boron diffusion, it was assumed that the simultaneous existence of a high boron and of an arsenic concentration furthers the forming of dislocations. Surprisingly, it has now been found that with the method as disclosed by the invention being used, there appear neither the "60°" nor the "90° dislocations". This is significant when it is noted that when the method as disclosed by the invention is used, the arsenic-doped areas (arsenic surface concentration $C_O > 10^{21}$ arsenic atoms/cm$^3$) show after the boron coating (due to the $SiB_6$ formation) a boron surface concentration $C_O$ of approximately $10^{22}$ boron atoms/cm$^3$, and after drive-in a $C_O$ of $7.10^{20}$ boron atoms/cm$^3$. These values are higher than the corresponding values obtained with known methods. By using the method as disclosed by the invention it has thus become possible to determine the parameters for making very closely packed semiconductor structures not only in such a manner that an overlapping of arsenic and boron-doped areas can be tolerated in exceptional cases, but the parameters can be determined to such an extent that such areas necessarily have to overlap. In this manner, a much higher packing density than before can be achieved.

The foregoing and other objects, features and advantages of the invention will be apparent from the following more particular description of the preferred embodiments of the invention taken in conjunction with the accompanying drawing.

DESCRIPTION OF THE PREFERRED EMBODIMENTS

In the following description, $BBr_3$ is used as boron source throughout. It should, however, be pointed out that the method as disclosed by the invention is not restricted to the use of this source material. As silicon bodies, silicon wafers in disk form are used as they are generally employed for making integrated circuits. Briefly, the method as disclosed by the invention consists of three process steps. The first process step consists of a first heating process where, with a boron glass and a silicon-rich phase ($SiB_6$) being formed, the silicon wafer is coated with boron oxide. In this first heating process, which is an open diffusion, a gas stream is directed over the silicon wafers which contains, at least for a period of time, both boron and oxygen in any form. In the second process step, the boron glass formed is removed, and in the third process step the boron is driven into the silicon, at least partly.

For the first heating process, a tube furnace is used which is generally employed in semiconductor technology. These furnaces contain a cylindrical heating element which surrounds the reaction tube. The heating arrangement is of such design that in the center of the furnace, extending over a distance between 30 and 60 cm along the axis of the heating element, a uniform temperature is maintained with a precision of ±1° C. Stated another way, such an arrangement provides a temperature profile along the axis of the heating element, in its middle, that is flat over a distance of between approximately 30 and 60 cm. The reaction tube used for carrying out the method as disclosed by the invention can be of various types of design; an advantageous embodiment is shown in FIG. 1.

The schematic representation of FIG. 1 is not to scale, particularly as applies to the height-length ratio. Reaction tube 1 with circular cross-section shows at its end an opening 2 through which boats 12 containing silicon wafers 13 are inserted into the reaction tube. Opening 2 can be closed with ground cap 3. Through the other closed end of reaction tube 1 a supply tube 4, which concentrically contains a supply tube 6, is inserted into reaction tube 1, approximately along the tube axis. Outside reaction tube 1, a supply tube 5 opens into supply tube 4. Supply tubes 4 and 6 open into a mixing chamber 9 which is used for intensively mixing the incoming gases and which on its side facing opening 2 shows a perforated plate 10.

The mixing chamber is round and its outer diameter is slightly smaller than the inner diameter of reaction tube 1. Near opening 2, a supply tube 7 opens into reaction tube 1, and between said supply tube 7 and perforated plate 10 a drain tube 8 branches off. At the branching-off point of drain tube 8 a baffle 11 is provided in the reaction tube, said baffle consisting of two interconnected round disks which are arranged in parallel to each other, concentrically, and perpendicularly to the tube axis, and whose diameter is slightly smaller than the inner diameter of tube 1. Between perforated plate 10 and baffle 11 there is the reaction zone containing silicon wafers 13 for processing. For this processing, silicon wafers 13 are first inserted into the slots of a boat 12 in which they stand perpendicularly and in parallel to each other, and subsequently boat 12, after ground cap 3 and baffle 11 have been removed, is inserted through opening 2 into the reaction zone of tube 1 where silicon wafers 13, whose diameters are approximately ¾ of the inner tube diameter, are placed perpendicularly to the reaction tube axis. Subsequently, baffle 11 is returned to its position, and openings 2 is closed with ground cap 3. When the boat is removed again, the above-specified process is repeated in reversed order. All parts shown in FIG. 1 (except of course the silicon wafers) are preferably made of quartz. Gas supply and gas drain of reaction tube 1 are performed in the following manner: through supply tube 4, there flows the carrier gas ($Ar_H$) which preferably consists of argon and into which during coating a relatively small amount of argon containing $BBr_3$ is fed through supply tube 5 from outside the reaction tube. The relatively small argon quantity for entry into tube 5 is charged with $BBr_3$ by directing same through fluid $BBr_3$, the argon absorbing an amount of $BBr_3$ which corresponds to the saturation quantity at the temperature of the $BBr_3$. Consequently, a predetermined $BBr_3$ concentration in the argon is fixed in that the $BBr_3$ is kept at a predetermined temperature. If required, oxygen is fed through tube 6. The $BBr_3$ mixes with the oxygen only after having reached the mixing chamber which is kept at practically that temperature at which the silicon wafers are coated with boron oxide. Through supply tube 7 a predetermined argon quantity ($Ar_s$) flows for stabilizing the gas flowing over silicon wafers 13. The gases streaming into reaction tube 1 are drained through drain tube 8.

For driving-in the boron, a furnace of the type used for the coating process is generally used. The reaction tube used for driving-in has an open end that can be closed with a ground cap and through which the batch is inserted into the furnace, and removed again. At the other end of the tube there is a gas inlet through which nitrogen or argon, respectively, or oxygen and/or steam are introduced, depending on the gas atmosphere required. If necessary, a baffle is placed between the gas inlet and the silicon wafers (arranged approximately in the middle of the tube in a boat perpendicularly to the tube axis and in parallel to each other) to ensure a homogeneous distribution of the incoming gas. For introducing steam into the reaction tube, water is evaporated outside the reaction tube and then streams under its own pressure into the reaction furnace, either in unmixed form or in the form of an oxygen-steam mixture. For driving-in, the same boat construction can be used as during the coating process. The silicon wafers are processed, with the method as disclosed by the invention, either to generate a doped area comprising an entire surface of the silicon wafer, or for doping selected surface areas only of the silicon wafer, which is most probably the standard process in a large scale utilization. In the latter case, the silicon wafer is covered in a known manner with a diffusion mask which preferably consists of silicon dioxide and which, in those spots where boron is to be diffused into the silicon, shows windows extending down to the silicon.

Before the wafers can be exposed to the first heating process, the reaction tube has to be pre-processed where some time has elapsed since the processing of the preceding batch, or the reaction tube has just been cleaned. For this pre-processing, the reaction tube is heated to the coating temperature with the required temperature profile being maintained, then (without there being any silicon wafers in the tube) a gas mixture is made to flow through the reaction tube which shows the same composition as when boron is deposited on the silicon wafers, in accordance with the method as disclosed by the ivnention. This pre-doping causes the forming of boron glass on the walls of the reaction tube, on the baffle, and on the mixing chamber. If this pre-doping is performed until equilibrium is reached, it ensures that when a batch of silicon wafers is processed no boron is lost through being deposited on the above-mentioned quartz parts. The time necessary for the pre-doping process is determined by exposing silicon wafers to the process under the same conditions as product wafers, and subsequently determining whether the test wafers exhibit the specified surface resistance and penetration depth, or doping profiles. If this is not so, the pre-doping is continued.

It should be pointed out here that even if no batches have been processed, or if there has been no pre-doping, the reaction tube is always kept at coating temperature, and rinsed with oxygen. After a large number of batches (order of 10) have been processed, it will be apparent that, in spite of the specified process conditions having been observed, the resistance values rise or fall. If this rise or fall is so marked that the values obtained are outside the specific ranges, the reaction tube and all the other quartz instruments used in the first heating process have to be freed of boron glass, and cleaned.

The silicon wafers which are to be exposed to the first heating process are preferably arranged near the center portion of the boat so that at both ends several fully oxidized silicon wafers can be inserted. In addition, two or three test wafers are processed together with the product wafers. The boat is then brought into the reaction zone, which is either at coating temperature already or at a temperature lower by 70° to 100° C. In the latter case, the tube is heated approximately 20 minutes to the coating temperature. First, the silicon wafers are exposed to a gas flow which consists of argon only, or of argon with a small oxygen admixture. Argon is preferred to nitrogen because the latter can form with silicon small quantities of silicon nitride. Before being exposed to a gas atmosphere containing boron or, if the first rinsing took place with argon only then a gas atmosphere containing both boron and oxygen, the silicon wafers have to be heated to the predetermined coating temperature with a precision of ±1° C.

To permit the deposition of a boron glass on the silicon wafers, the reaction gas has to contain boron and oxygen. As pointed out above, argon containing $BBr_3$ is directed for this purpose over supply tube 5 into the argon serving as carrier gas and flowing in supply tube 4. Supply tube 4 opens into the mixing chamber, and the same applies to tube 6 which supplies oxygen. For the homogeneity and reproducibility of the diffusion it is of importance that oxygen and $BBr_3$ react with each other at coating temperature, for which reason mixing chamber 9 is positioned in the reaction tube in such a manner that it is in the flat part of the temperature profile. In the mixing chamber, the gas mixture is violently agitated and leaves the chamber through perforated plate 10. Due to the joint action of several factors including the configurations of perforated plate 10 and baffle 11, the geometric arrangement of both perforated plate 10 and baffle 11 with respect to the reaction zone, the gas drain through drain tube 8, and last but not least, the introduction of an additional argon stream through supply tube 7, it is ensured that all silicon wafers of the batch are exposed over their entire surface and with respect to each other to exactly the same gas atmosphere. This homogeneity of the gas atmosphere is important for obtaining homogeneous and reproducible diffusion results. However, another decisive factor is how the $O_2:BBr_3$ ratio and the $BBr_3$ quantity flowing through the reaction tube per minute are determined.

It should be noted that the $SiB_6$ phase is formed even at an $O_2:BBr_3$ molar ratio which is higher than 65. It is, however, of advantage not to exceed this $O_2:BBr_3$ ratio. A relatively low oxygen content improves the homogenity and reproducibility of the diffusion results and, as more particularly pointed out in detail below, it may be of decisive importance for the quality of highly doped boron areas that in their production the influence of oxygen be kept as low as possible. Another important factor for the homogenity and reproducibility of results is that if the reaction tube has an inner diameter of approximately 8 cm, and if the overall gas stream is between approximately 2 and approximately 5 liters/minute, the $BBr_3$-quantity/minute is between approximately 15 and 30 milligrams. The predetermined coating period, which has to be strictly observed, depends on the desired surface resistance, on the coating temperature, and on whether the second heating process operations take place in an oxidizing or in an inert gas atmosphere. After coating, and before being removed from the furnace, the silicon wafers are either maintained for a precisely predetermined period at coating temperature, or they are first kept for a precisely predetermined period at coating temperature and then are cooled for approximately 20 minutes by 70° to 100° C., that being the range the furnace is cooled of its own accord. The predetermined periods also depend on the required diffusion profiles.

After the cooling of the wafers to room temperature, the boron glass is removed. The etchability of the boron glass depends on the $O_2:BBr_3$ ratio which has been used in its production. Boron glasses made in the presence of a relatively high amount of oxygen are easily soluble in diluted hydrofluoric acid. The diluted hydrofluoric acid, however, also dissolves $SiO_2$, therefore the etching of boron glass with diluted hydrofluoric acid is disadvantageous in all those cases where the silicon wafers show $SiO_2$-layers required for masking and/or passivation purposes, because these layers could then be attacked uncontrollably. The boron glass made in accordance with the method as disclosed by the invention cannot be completely removed by means of diluted hydrofluoric acid. For its complete and reliable removal, an etching cycle has been developed where the silicon wafers are first immersed for ten seconds in diluted hydrofluoric acid (one part fluoric acid, ten parts water), subsequently processed for ten minutes in concentrated nitric acid heated to 95° C., and finally immersed once more for 30 seconds in diluted hydrofluoric acid (1:10). Under these conditions existing $SiO_2$ is not substantially removed in the removal process. The removal process, as disclosed by the invention, has the further advantage that the $SiB_6$ phase and silicon are practically not affected thereby.

After the removal of the boron glass, the silicon wafers are exposed to the second heating process. There, it is only important to expose the silicon wafers precisely for a predetermined period to an inert or an oxidizing atmosphere, and to strictly maintain a predetermined temperature. These conditions are easily observed with present day experience and equipment.

Depending on whether low or high doping areas are to be produced it is advantageous to employ specific embodiments of the method as disclosed by the invention which differ in some essential points.

In the production of low-doping areas, i.e. such areas which at a penetration depth $(x_j)$ (depth of P/N-junction) between approximately 0.5 and approximately 1 $\mu m$ show a surface resistance between approximately 300 and approximately 600$\Omega/\square$, it has hitherto been particularly difficult to obtain homogeneous results over the silicon wafers and over the batch with a high reproducibility. The smallest tolerances of surface resistance values which could be observed when using the methods as disclosed by prior art had been values $>\cdot 13\%$.

Figure 2:
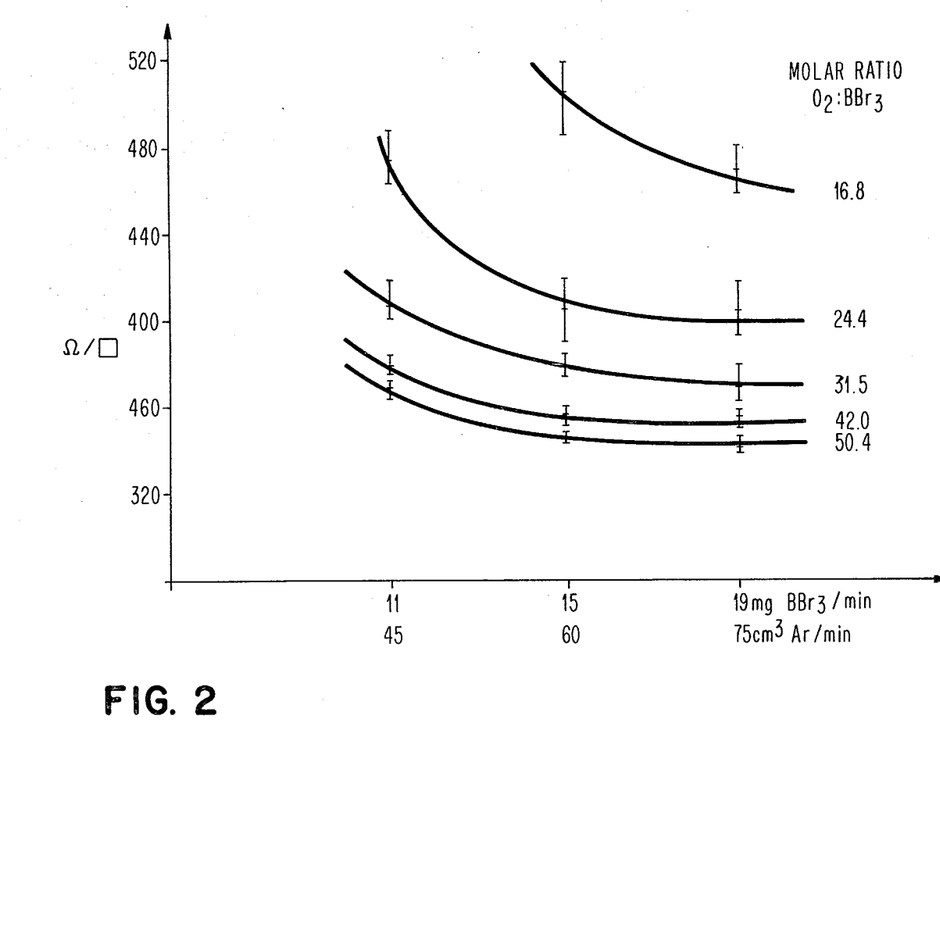
FIG. 2 is a diagram of the dependence of the surface resistances in a highly resistant boron diffusion on the bromide boron quantity which is added to the gas mixture flowing over the semiconductor wafers, for various oxygen:$BBr_3$ ratios.

It has been found that when the method as disclosed by the invention is used for making low-doping areas, much closer tolerances can be observed. Surprisingly, the observing of specific $O_2:BBr_3$-ratios and the use of $BBr_3$-quantities/minute within a predetermined quantity range are of decisive importance in the coating process. This fact can be demonstrated by means of FIG. 2 which shows a diagram representing surface resistance values measured in boron-doped areas after having been exposed to all high temperature processes to which silicon wafers are exposed in the production of bipolar transistors from base diffusion onward, as plotted against $BBr_3$ quantities/minute for different $O_2:BBr_3$ molar ratios. The other process parameters were the same as in Examples 1 to 4 (see Table I). FIG. 2 shows that if a transition is made from small $BBr_3$ quantities and from relatively low $O_2:BBr_3$ molar ratios, respectively, the surface resistance values become increasingly insensitive with respect to alterations of these two parameters.

Since it has furthermore been found that when the $O_2:BBr_3$ molar ratio is increased over the value of approximately 65 the uniformity of the boron glass decreases and the spreading of the surface resistance value increases, it is evident that the best $O_2:BBr_3$ molar ratios are between approximately 20 and approximately 65. If operations take place at an $O_2:BBr_3$ ratio within this range, at a temperature between 850° and 950° C., and at a coating time in the order of 20 minutes, it is of advantage for obtaining surface resistance values between approximately 300 and approximately 600$\Omega/\square$, set a $BBr_3$ quantity per minute between approximately 15 and approximately 30 milligrams.

During the first heating process for production of low-doping areas, an argon stream between approximately 3 and approximately 4 liters/minute and an oxygen stream between approximately 0.05 and approximately 0.15 liters/minute flow past the silicon wafers which have a diameter of approximately 57 mm/82 mm and which are provided in a reaction tube with an inner diameter of approximately 10 cm. Furthermore, an argon stream of approximately 0.5 liters/minute (acting to perform a stabilizing function) flows from the reaction tube opening toward the $Ar/O_2$ mixture. During the coating phase $BBr_3$-loaded argon is admixed to the $Ar/O_2$ mixture. The drive-in of the boron into the silicon takes place in an oxidizing atmosphere in the production of low boron-doped zones with a $SiO_2$-layer, that can be used for masking and passivation purposes, being grown in the process. In such process, a considerable part of the boron in the silicon is dissolved in the oxide so that surface resistance is increased considerably. Oxidation takes place first with pure oxygen, then for the acceleration of the oxidation process for an extended period with steam, and finally once more with pure oxygen.

In the production of highly boron-doped areas, following the method as disclosed by the invention, the effect of the oxygen is restricted, not only for reasons of the necessary homogenity and reproduciblity of the results, but also to ensure in all those cases where the highly boron-doped areas overlap with highly arsenic-doped areas (or are generated in such areas) that no crystal dislocations are formed. In the production of highly doped areas, therefore, oxygen, which reacts with $BBr_3$ to form boron oxide, is added to the gas mixture only during the deposition of boron oxide on the silicon wafer. During heating, post-treatment, and the cooling of the wafers, a gas stream $(Ar_H)$ containing argon only flows through the reaction tube and over the wafers. This gas stream is met by an argon stream $(Ar_S)$ from the opening of the reaction tube. During the coating phase, which takes between three and five minutes, only the argon stream $(Ar_H)$ is intensified over the wafers, and boron and oxygen are added thereto. Preferably the $O_2:BBr_3$ molar ratio is not higher than 65 and, in order to obtain after the drive-in process in the second heating process a penetration depth between approximately 0.5 and approximately 1 $\mu m$ and a surface resistance between 30 and 40$\Omega/\square$, A $BBr_3$ quantity/minute is set in the first heating process between approximately 15 and 30 milligrams/minute. Such results obtain when the operation takes place in the first heating process at temperatures between approximately 950° and 1000° C. using an inner tube diameter of approximately 10 cm and a total gas stream between approximately 2 and approximately 5 liters/minute.

For making highly doped areas, in accordance with the method as disclosed by the invention, drive-in in the second heating process takes place in an inert gas atmosphere at temperature between approximately 950° and 1050° C. During drive-in in an inert atmosphere some boron is lost through diffusion out of the silicon but the silicon is dissolved in the growing silicon dioxide. Therefore, a coating phase between three and five minutes will suffice under these conditions for depositing the necessary amount of boron oxide on the silicon. If coating takes place in less than three minutes it will be difficult to control the process. The boron profiles, formed with the method as disclosed by the invention under typical conditions during the first and the second heating process, are shown in FIG. 3.

Figure 3:
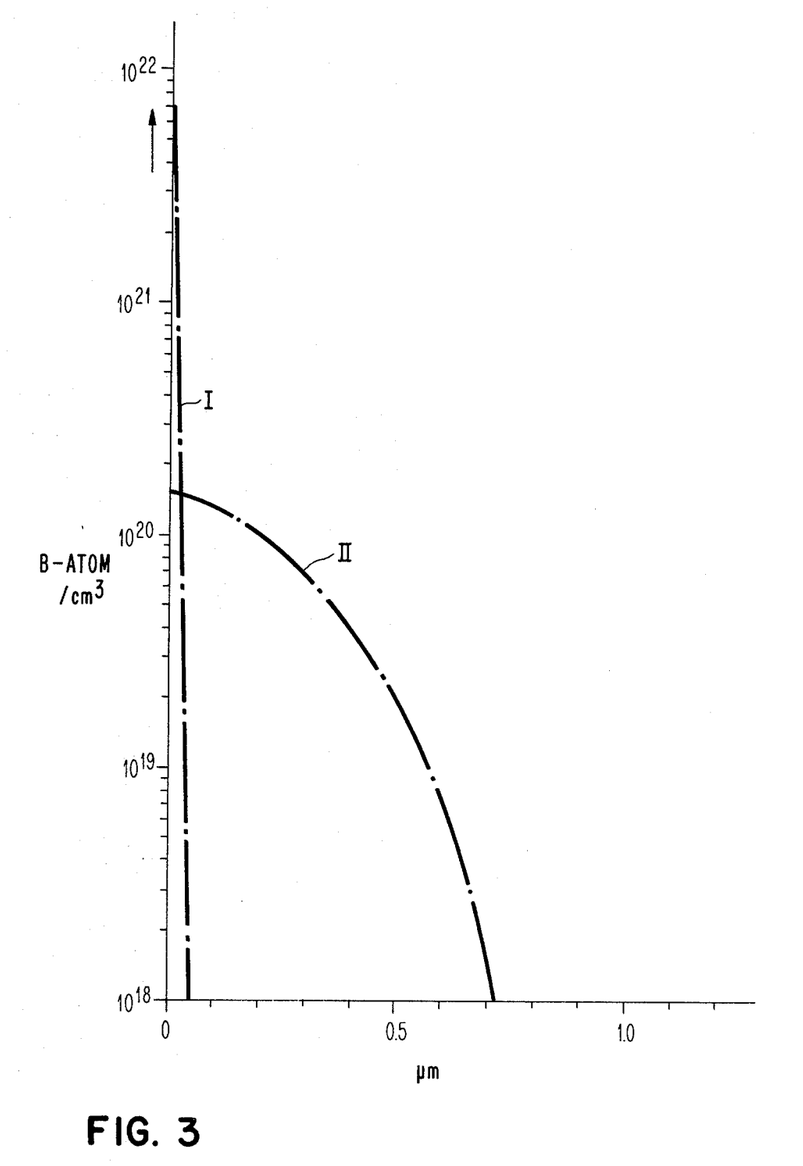
FIG. 3 shows boron profiles in a silicon body (plotted against penetration depth) measured after the first and the second heating process, said profiles having been formed in the execution of an embodiment of the method as disclosed by the invention.

FIG. 3, in particular, shows a diagram where the boron concentrations over the associated distances from the surface of a silicon area, not containing any arsenic, are given. Curve I shows the boron profile after the first heating process, and curve II shows the boron profile after the second heating process. It may be concluded from the figure that, after the first heating process the concentration of boron at the surface $(C_{oB})$ is in the order of $10^{22}$ boron atoms/$cm^3$, and that the penetration depth is less than 0.1 $\mu m$. After drive-in the surface concentration of the boron $(C_{oB})$ is still above $10^{20}$ boron atoms/cm$^3$, and the penetration depth is at approximately 0.7 μm. The boron measured after drive-in by means of a photometric analysis method lies at 4.5.10$^{15}$ boron atoms/cm$^3$. Corresponding values obtained in the production of highly doped boron areas by means of a conventional method in accordance with prior art are, after the first heating process, a $C_{oB}$ of 5.5.10$^{20}$ boron atoms/cm$^3$, and an $x_j$ of 0.6 μm, and after the drive-in a $C_{oB}$ of 3.10$^{19}$ boron atoms/cm$^3$, and an $x_j$ of 1.4 μm. Thus, the concentration values in the production of highly doped areas in accordance with the method as disclosed by the invention are higher than in the production of such areas by means of conventional methods in accordance with prior art. As pointed out above, it is quite surprising that in the overlapping zones between a highly arsenic-doped area (typical surface concentration $C_{oAs}$ approximately 10$^{21}$ arsenic atoms/cm$^3$) and a highly boron-doped area made in accordance with the method as disclosed by the invention, the crystal dislocations known to the prior art do not appear.

Figure 4A:
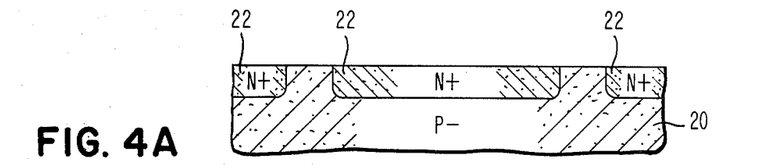
FIGS. 4A–4E show schematic cross-sections through a semiconductor structure in various production stages using the method as disclosed in accordance with the present invention.
Figure 4B:
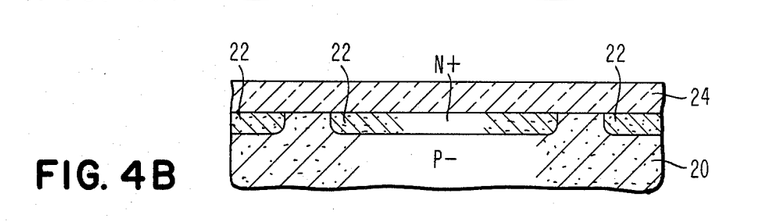
Figure 4C:
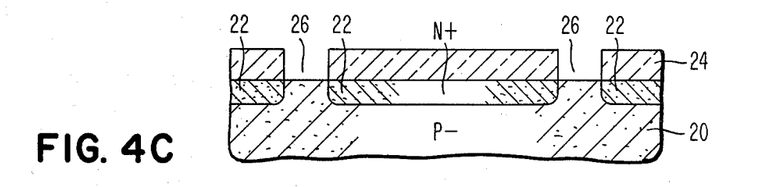
Figure 4D:
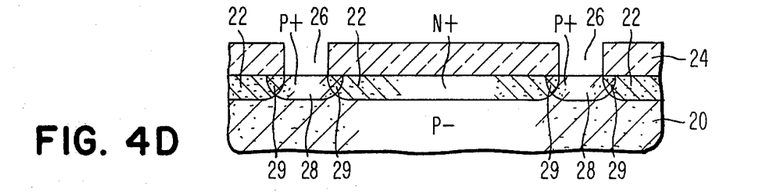

For further explaining the method as disclosed by the invention, the production of a semiconductor structure will now be described by means of FIGS. 4A to 4E, the method as disclosed by the invention being advantageously applicable in such a production. FIG. 4A shows a substrate of low P-doping in which highly N-doped areas 22 are formed. Over the entire surface of this structure, a silicon dioxide layer 24 is applied by means of thermal oxidation. The result of this operation is shown in FIG. 4B. In layer 24, the diffusion mask for the sub-isolation diffusion is formed according to the required dimensions and the required geometric arrangement of the diffusion areas, as shown by openings 26 reaching down to substrate 20 in FIG. 4C. Subsequently, the structure is processed, in accordance with the method as disclosed by the invention, for generating highly P-doped areas 28. The result is shown in FIG. 4D, which also shows overlapping zones 29 between the areas 22 which are highly N-doped with arsenic and areas 28 which are highly P-doped with boron.

Figure 4E:
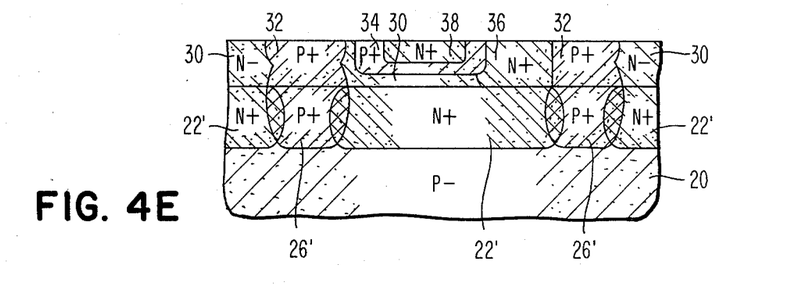

Thereafter, silicon dioxide layer 24 is removed and epitaxial layer 30 is grown instead over the entire surface, as shown in FIG. 4E. By means of outdiffusion, the arsenic atoms and the boron atoms are partly introduced during this process from areas 22 or 28 into those areas of the epitaxial layer which are above these areas. Thus, the highly N-doped areas 22' and the highly P-doped areas 26', shown in FIG. 4E, are formed.

Subsequently, the structure is selectively exposed to another boron diffusion, the method as disclosed according to the present invention being advantageously applicable. During this boron diffusion, areas 32 and 34 of low P-doping are generated, areas 32 together with areas 26' serving for isolation purposes, and areas 34 serving as base zones of bipolar transistors. Then, highly N-doped areas 36 and 38 are produced in a known manner, areas 36 serving for facilitating the collector contact, and as a connection between the silicon surface and the subcollector areas 22', and areas 38 serving as emitter zones of bipolar transistors. The finished structure is shown in FIG. 4E.

The utilization of the method as disclosed by the invention in the boron diffusions described above for the production of the structure of FIG. 4E has various considerable advantages, as compared with the use of known methods. If the method as disclosed by the invention is used for carrying out the sub-isolation diffusion there will be no crystal dislocations in the overlapping areas 29; they would appear if the sub-isolation diffusion would be executed following known open diffusion processes. First, the dislocations would cause an uncontrolled out-diffusion of areas 22' and 26' into epitaxial layer 30, and also the spreading of the dislocations into the structure areas adjacent to overlapping areas 29 would drastically increase the probability of collector-emitter short circuits in the bipolar transistors.

Another advantage of the use of the method as disclosed by the invention for sub-isolation diffusion resides in the fact that the penetration depth of the diffusion is smaller after the second heating process than in the methods as disclosed by prior art, with the attendant advantage that the lateral outdiffusion of the boron after the growing of the epitaxial layer is smaller than after known boron diffusion processes. Since the method as disclosed by the invention provides, in the production of low-doped areas (e.g. the base zones), much more homogeneous and reproducible results than the methods according to prior art, the method as disclosed by the invention permits a smaller base width due to improved control than known processes. It can thus be seen that the method of the invention permits the production of integrated circuits that are much more reliable and at the same time much more closely packed.

For further explaining the method as disclosed by the invention, the parameters used in the heating processes and the results of six embodiments are given below. Examples 1 to 4 of Table I are boron diffusions for the production of low-doped areas, and Examples 6 and 7 of Table II are boron diffusions for producing highly doped areas. In these examples, the boron glass is removed after each first heating process. In Examples 1 to 4 a third heating process is executed where the silicon wafers are exposed to the same temperature conditions as in the production of the emitter of a bipolar transistor. The results of this third heating process are also given in Table I. In all examples, the reaction tube has an internal diameter of approximately 10 cm, and the silicon wafers have a diameter of approximately 57 mm/82 mm.

TABLE I

| EXAMPLES: | 1 | 2 | 3 | 4 |
|---|---|---|---|---|
| 1st heating process | | | | |
| T(°C.) | 875 ± 1 | 875 ± 1 | 875 ± 1 | 875 ± 1 |
| Ar$_H$(l/min)* | 3.2 | 3.2 | 3.2 | 3.2 |
| O$_2$(l/min)* | 0.08 | 0.06 | 0.08 | 0.08 |
| Ar$_S$(l/min)* | 0.5 | 0.5 | 0.5 | 0.5 |
| pre-processing A(min)** | 15 | 5 | 15 | 15 |
| coating A(min) | 20 | 28 | 10 | 8 |
| | | 30 | | |
| Ar$_{BBr_3}$(l/min) | 0.08 | 0.06 | 0.08 | 0.08 |
| post-processing A(min) | 15 | 15 | 15 | 15 |
| | | 10 | | |
| boron glass thickness | | | | |

TABLE I-continued

| EXAMPLES: | 1 | 2 | 3 | 4 |
|---|---|---|---|---|
| (nm) | 80 | 200 | 60 | 40 |
| $R_{s1}$ (Ω/□) | 111 ± 2 | 85 ± 1 | 125 ± 3 | 140 ± 4 |
| $x_{j1}$ (μm) | 0.015 ± 0.1 | 0.15 | 0.15 | 0.15 |
| 2nd heating process | | | | |
| T(°C.) | 925 ± 1 | 925 ± 1 | 925 ± 1 | 925 ± 1 |
| A(min) | 10 | 10 | 10 | 10 |
| $O_2$(l/min) | 1.5 | 1.5 | 1.5 | 1.5 |
| A(min) | 51 | 51 | 51 | 51 |
| $H_2O_D$ | yes | yes | yes | yes |
| A(min) | 10 | 10 | 10 | 10 |
| $O_2$(l/min) | 1.5 | 1.5 | 1.5 | 1.5 |
| $R_{s2}$ (Ω/□) | 450 ± 30 | 330 ± 20 | 500 ± 30 | 700 ± 30 |
| $x_{j2}$ (μm) | 0.45 ± 0.1 | 0.45 | 0.45 | 0.45 |
| 3rd heating process | | | | |
| A(min) | 180 | 180 | 180 | 180 |
| T(°C.) | 1000 | 1000 | 1000 | 1000 |
| $R_{s3}$ (Ω/□) | 400 ± 20 | 300 ± 20 | 520 ± 25 | 660 ± 25 |
| $x_{j3}$ (μm) | 0.75 ± 0.1 | 0.75 ± 0.1 | 0.75 ± 0.1 | 0.75 ± 0.1 |

*during the entire first heating process
**A(min) = time in minutes

TABLE II

| EXAMPLES: | 5 | 6 |
|---|---|---|
| 1st heating process | | |
| quick heating T(°C.) | R.T.-900 | R.T.-970 |
| slow heating T(°C.) | 900–970 | 970 |
| or pre-processing A(min)** | 22 | 15 |
| Ar(l/min) | 1.5 | 1.5 |
| $Ar_s$(l/min)* | 0.5 | 0.5 |
| coating T(°C.) | 970 ± 1 | 970 ± 1 |
| A(min) | 4 | 4 |
| $Ar_H$(l/min) | 3.6 | 3.6 |
| $O_2$(l/min) | 0.1 | 0.1 |
| $Ar_{BBr_3}$(l/min) | 0.1 | 0.1 |
| post-treatment A(min) | 5 | 10 |
| Ar(l/min) | 1.5 | 1.5 |
| slow cooling T(°C.) | 970–900 | does not apply |
| A(min) | 20' | |
| Ar(l/min) | 1.5 | |
| quick cooling T(°C.) | 900-R.T. | 970-R.T. |
| boron glass thickness (nm) | 50–80 | 50–80 |
| $R_{s1}$ (Ω/□) | 65 ± 5 | 100 ± 5 |
| $x_{j1}$ (μm) | <<0.1 | <<0.1 |
| 2nd heating process | | |
| T(°C.) | 1000 ± 1 | 1000 ± 1 |
| A(min) | 80 | 80 |
| $N_2$ or Ar(l/min) | 1 | 1 |
| $R_{s2}$ (Ω/□) | 32 ± 4 | 75 ± 5 |
| $x_{j2}$ (μm) | 0.08 ± 0.1 | 0.08 ± 0.1 |

*flows during the entire first heating process
**A(min) = time in minutes

In the tables, $Ar_H$ represents the main stream consisting of argon, $Ar_s$ the stabilization stream flowing toward the main stream and Ar(BBr$_3$) an argon stream which had been charged with BBr$_3$ by directing Ar through BBr$_3$ heated to 5° C. with 100 milliliters of argon absorbing 25 milliliters of BBr$_3$. Also, $Rs_1$, $Rs_2$, and $Rs_3$ (the same applies to $xj_1$, $xj_2$, $xj_3$) represent the surface resistances (or penetration depths, respectively) after the first, the second, and the third heat treatment glass and $H_2O_D$ represents steam. Table I shows, in particular, the insignificant spreading of the Rs values even after the last heat treatment, and that this insignificant spreading is also maintained in a large resistance range. Example 2 shows, in addition, that favorable results are also obtained when, if required, coating is executed in two steps interrupted by an oxidizing heat treatment. Table II shows, in particular, that in the first heating process a precise observance of coating times is of particular importance.

While the invention has been particularly shown and described with reference to the preferred embodiment thereof, it will be understood by those skilled in the art that various changes in form and detail may be made therein without departing from the spirit and scope of the invention.

Having thus described my invention, what I claim as new, and desire to secure by Letters Patent is:

1. A method of doping a silicon body through diffusion of boron, comprising the steps of:
   exposing said body to a gas mixture including BBr$_3$ and O$_2$ with said gas mixture formed at the coating temperature of BBr$_3$ and O$_2$ as contained in a flowing carrier gas such that the molar ratio of O$_2$:BBr$_3$ lies between 20 and 65 so as to thereby form a boron glass layer over said body with a silicon-rich boron layer being formed between said glass layer and body in selected areas of said body;
   removing said boron glass layer so formed without adversely affecting said silicon-rich boron layer; and
   heating said body so that at least a portion of the boron from said silicon-rich boron layer is driven into said silicon body to thereby selectively dope said silicon body.

2. The method as set forth in claim 1 wherein said step of removing said boron glass layer comprises the steps of:
   partially removing said layer in diluted hydrofluoric acid,
   treating said layer in hot nitric acid, and
   finally removing said layer in diluted hydrofluoric acid.

3. The method as set forth in claim 2 wherein said step of partially removing said glass layer comprises immersing said body for 10 seconds in hydrofluoric acid diluted with water in a ratio of 1:10, said step of treating said layer comprises immersing said body for 10 minutes in concentrated nitric acid heated to 95° C., and said step of finally removing said layer comprises immersing said body for 30 seconds in hydrofluoric acid diluted with water in a ratio of 1:10.

4. The method as set forth in claim 1 wherein said exposing step takes place between 850° C. and 950° C. and said heating step takes place in an oxidizing atmosphere.

5. The method as set forth in claim 1 wherein said exposing step takes place between 950° C. and 1000° C. with a minimum of oxygen and said heating step takes place in an inert atmosphere.

6. The method as set forth in claim 5 wherein during said exposing step said body is briefly exposed to a gas mixture containing oxygen as well as boron.

7. The method as set forth in claim 7 wherein said inert atmosphere is argon.

8. In a process of doping silicon bodies through diffusion of boron, the improvement comprising:
   exposing said bodies in a reaction tube to a gas mixture including $BBr_3$ and $O_2$ with said $BBr_3$ added in an amount between approximately 15 and 30 milligrams/minute and said oxygen added in an amount as related to the amount of $BBr_3$ added to give a molar ratio of $O_2:BBr_2$ between 20 and 65 such that a boron glass layer is formed over each of said bodies with a silicon-rich boron layer being formed between said glass layer and corresponding body in unmasked areas of said body;
   removing said boron glass layer from said bodies without adversely affecting said silicon-rich boron layer; and
   heating said bodies so that at least a portion of the boron from said silicon-rich boron layer is driven into said silicon bodies.

9. The process as set forth in claim 8 wherein said reaction tube has an inner diameter of approximately 10 cm and wherein said gas mixture is transported in a carrier gas having a forward flow between 2 and 5 liters/minute and a backflow between 0.5 and 1 liter/minute.

10. The process as set forth in claim 9 wherein argon is used as said carrier gas and stabilization gas.

11. The method as set forth in claim 8 including exposing said bodies in a reaction tube at a temperature of approximately 875° C. to a gas mixture including 3.2 liters of argon/minute and 0.08 liters of oxygen/minute for approximately 15 minutes and then to said gas mixture with an additional 0.08 liters of argon/minute added to it for approximately 20 minutes.

* * * * *

UNITED STATES PATENT AND TRADEMARK OFFICE
CERTIFICATE OF CORRECTION

PATENT NO. : 4,249,970
DATED : February 10, 1981
INVENTOR(S) : M. Briska et al

It is certified that error appears in the above–identified patent and that said Letters Patent are hereby corrected as shown below:

Colum 7, Line 3 - "bromide boron" should be --boron bromide--.

Column 11, Line 24 - "> • 13%" should be --> ± 13%--.

Column 13, Line 4 - "4.5.$10^{15}$" should be --4.5•$10^{15}$--.

Column 13, Line 8 - "5.5.$10^{20}$" should be --5.5•$10^{20}$--.

Column 13, Line 9 - "3.$10^{19}$" should be --3•$10^{19}$--.

Column 15, Line 59 - delete "glass".

Column 17, Line 8 - "claim 6" should be --claim 7--.

Signed and Sealed this

Fifth Day of May 1981

[SEAL]

Attest:

RENE D. TEGTMEYER

Attesting Officer    Acting Commissioner of Patents and Trademarks